United States Patent
Obiya et al.

(10) Patent No.: US 11,652,499 B2
(45) Date of Patent: May 16, 2023

(54) RADIO FREQUENCY MODULE AND COMMUNICATION DEVICE

(71) Applicant: MURATA MANUFACTURING CO., LTD., Kyoto (JP)

(72) Inventors: Hidenori Obiya, Nagaokakyo (JP); Hirotsugu Mori, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 17 days.

(21) Appl. No.: 17/160,982

(22) Filed: Jan. 28, 2021

(65) Prior Publication Data
US 2021/0242889 A1 Aug. 5, 2021

(30) Foreign Application Priority Data
Feb. 5, 2020 (JP) .............................. JP2020-017693

(51) Int. Cl.
*H04B 1/00* (2006.01)
*H04B 1/401* (2015.01)
(Continued)

(52) U.S. Cl.
CPC ........... *H04B 1/0057* (2013.01); *H03F 3/195* (2013.01); *H03F 3/245* (2013.01); *H04B 1/006* (2013.01);
(Continued)

(58) Field of Classification Search
CPC ...... H04B 1/0057; H04B 1/006; H04B 1/401; H04B 1/0064; H03F 3/195; H03F 3/245; H03F 2200/111; H03F 2200/451; H03F 2203/7209; H03F 3/72; H04W 88/06; H01L 2223/6677; H01L 2224/13082; H01L 2224/13101; H01L 2224/1403; H01L 2224/16225; H01L 2224/16235; H01L 2224/81801; H01L 23/3121; H01L 23/3128; H01L 23/552; H01L 23/66; H01L 24/13; H01L 24/16; H01L 24/17; H01L 24/81; H01L 25/16; H01L 2924/00012;
(Continued)

(56) References Cited

U.S. PATENT DOCUMENTS 10,257,119 B2 4/2019 Wloczysiak et al.
2011/0227173 A1* 9/2011 Seppala ................ B81C 1/0023
257/E29.324

(Continued)

FOREIGN PATENT DOCUMENTS

JP 2019-140671 A 8/2019
WO 2019/167416 A1 9/2019

*Primary Examiner* — Nguyen T Vo
(74) *Attorney, Agent, or Firm* — Pearne & Gordon LLP

(57) ABSTRACT

A radio frequency module includes: a first terminal to which a signal of a first frequency band is inputted, the first frequency band being at least a portion of an unlicensed band higher than or equal to 5 GHz; a second terminal to which a signal of a second frequency band is inputted, the second frequency band being at least a portion of a licensed band lower than 5 GHz; a first amplifier configured to amplify a signal of the first frequency band inputted to the first terminal; and a second amplifier configured to amplify a signal of the second frequency band inputted to the second terminal. In the radio frequency module, the first amplifier and the second amplifier are disposed in one package.

12 Claims, 7 Drawing Sheets

(51) Int. Cl.
  *H03F 3/195* (2006.01)
  *H04W 88/06* (2009.01)
  *H03F 3/24* (2006.01)

(52) U.S. Cl.
  CPC ............ *H04B 1/401* (2013.01); *H04W 88/06* (2013.01); *H03F 2200/111* (2013.01); *H03F 2200/451* (2013.01)

(58) Field of Classification Search
  CPC ..... H01L 2924/00014; H01L 2924/014; H01L 2924/14; H01L 2924/15184; H01L 2924/15192; H01L 2924/15311; H01L 2924/15321; H01L 2924/181
  See application file for complete search history.

(56) References Cited

U.S. PATENT DOCUMENTS

| | | | |
|---|---|---|---|
| 2011/0299511 A1* | 12/2011 | Cook | H04W 84/105 |
| | | | 455/454 |
| 2014/0148191 A1* | 5/2014 | Feng | H04W 72/1215 |
| | | | 455/454 |
| 2018/0115438 A1* | 4/2018 | Park | H04W 36/04 |
| 2018/0152955 A1* | 5/2018 | Park | H04B 1/0057 |
| 2018/0166387 A1* | 6/2018 | Matsui | H01L 23/535 |
| 2018/0331709 A1* | 11/2018 | Kong | H04B 1/40 |
| 2018/0343747 A1* | 11/2018 | Yosui | H05K 3/361 |
| 2019/0253096 A1 | 8/2019 | Sato et al. | |
| 2020/0045731 A1* | 2/2020 | Yiu | H04W 74/006 |
| 2020/0403646 A1 | 12/2020 | Takada | |
| 2022/0015024 A1* | 1/2022 | Tanaka | H04W 48/18 |

* cited by examiner

RADIO FREQUENCY MODULE AND COMMUNICATION DEVICE

CROSS REFERENCE TO RELATED APPLICATION

The present application is based on and claims priority of Japanese Patent Application No. 2020-017693 filed on Feb. 5, 2020. The entire disclosure of the above-identified application, including the specification, drawings and claims is incorporated herein by reference in its entirety.

TECHNICAL FIELD

The present disclosure relates to radio frequency (RF) modules and communication devices.

BACKGROUND

Use and application of a frequency band that can be used without obtaining a radio station license (hereinafter referred to as an unlicensed band) in a mobile communication system used in, for example, mobile phones, is under consideration. For example, Licensed-Assisted Access (LAA) for using, in the 4th generation mobile communication system (4G), a 5 GHz unlicensed band used in a wireless local area network (WLAN) communication as a Long Term Evolution (LTE) carrier is standardized in Release 13 of the 3rd Generation Partnership Project (3GPP). U.S. Pat. No. 10,257,119 discloses a front end configuration that supports LAA.

BRIEF SUMMARY

However, in order to ensure isolation when the unlicensed band higher than or equal to 5 GHz and the licensed band lower than 5 GHz are simultaneously used, a transfer circuit of the unlicensed band higher than or equal to 5 GHz and a transfer circuit of the licensed band lower than 5 GHz cannot simply be arranged close to each other for the purpose of miniaturization. In contrast, when a distance between the two transfer circuits is ensured, the length of a signal line increases, leading to an increase in transfer loss and an increase in size.

In view of the above, the present disclosure is presented to provide a radio frequency module and a communication device which have small sizes and in which the deterioration of the signal quality of the unlicensed band higher than or equal to 5 GHz and the licensed band lower than 5 GHz is reduced.

In order to provide such a radio frequency module and such a communication device as described above, a radio frequency module according to one aspect of the present disclosure includes: a first terminal to which a signal of a first frequency band is inputted, the first frequency band being at least a portion of an unlicensed band higher than or equal to 5 GHz; a second terminal to which a signal of a second frequency band is inputted, the second frequency band being at least a portion of a licensed band lower than 5 GHz; a first amplifier configured to amplify a signal of the first frequency band inputted to the first terminal; and a second amplifier configured to amplify a signal of the second frequency band inputted to the second terminal. In the above-described radio frequency module, the first amplifier and the second amplifier are disposed in one package.

According to the present disclosure, it is possible to provide a radio frequency module and a communication device which have small sizes and in which deterioration of the signal quality of the unlicensed band higher than or equal to 5 GHz and the licensed band lower than 5 GHz is reduced.

BRIEF DESCRIPTION OF DRAWINGS

These and other advantages and features will become apparent from the following description thereof taken in conjunction with the accompanying Drawings, by way of non-limiting examples of embodiments disclosed herein.

DETAILED DESCRIPTION OF EMBODIMENTS

Figure 1:
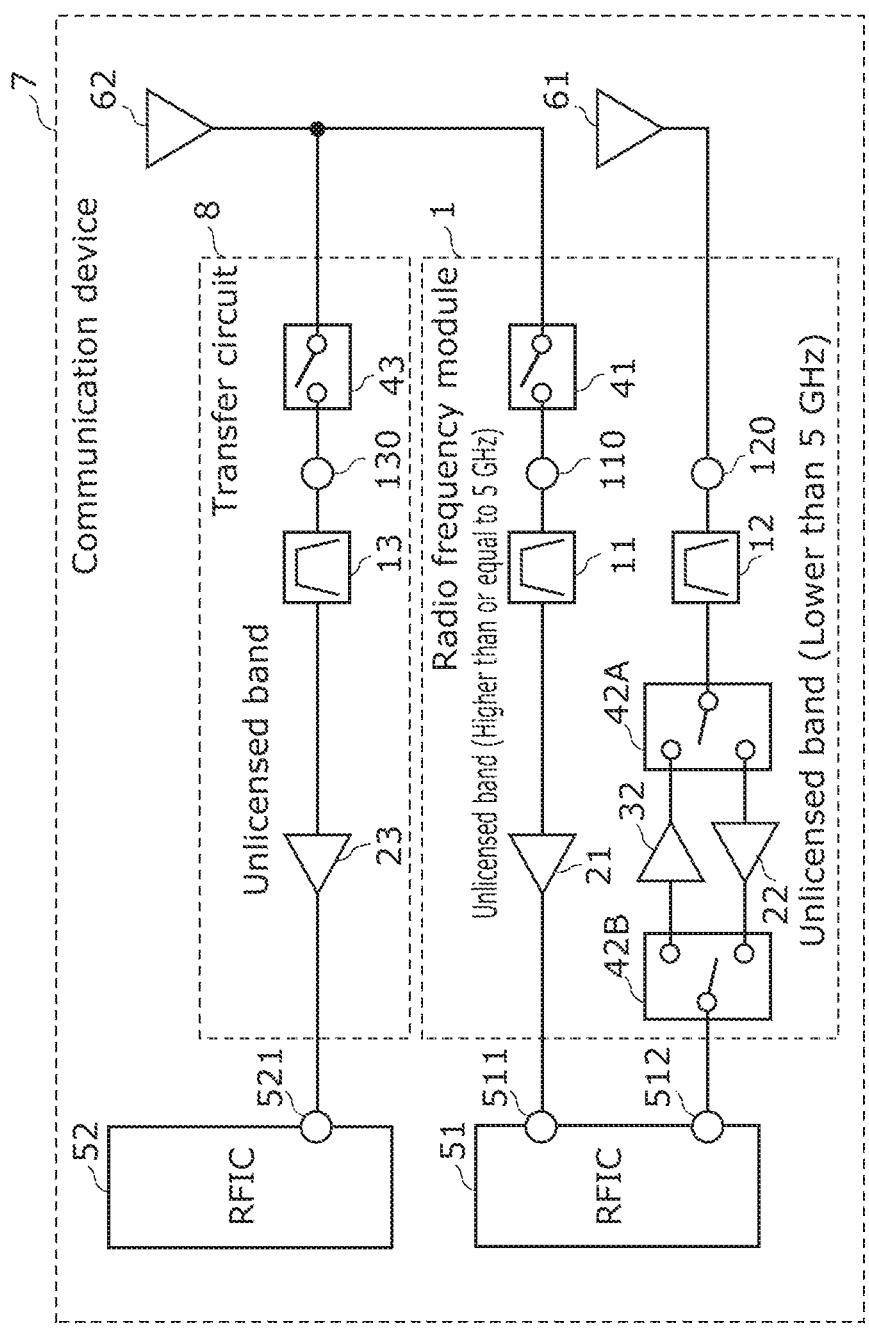
FIG. 1 is a diagram illustrating a circuit configuration of a radio frequency module (or an RF front-end circuitry) and a communication device according to an embodiment.

The following describes in detail embodiments of the present disclosure. Each of the embodiments described below illustrates a general or specific example. The numerical values, shapes, materials, structural components, the arrangement and connection of the structural components, and so on, illustrated in the following embodiments are mere examples, and therefore do not limit the present disclosure. Among the structural components in the following embodiments and variations of the embodiments, structural components not recited in the independent claims are described as arbitrary structural components. In addition, the sizes of structural components and the ratios of the sizes in the drawings are not necessarily strictly illustrated. In each of the diagrams, substantially the same structural components are denoted by the same reference signs, and redundant description may be omitted or simplified.

In addition, in the following description, terms indicating relationships between components such as parallel and vertical and terms indicating the shapes of components such as a quadrilateral shape, and numerical ranges do not represent only the strict meanings but include also a substantially equivalent range, such as a difference of approximately several percent.

In addition, in the following description, in an example of A, B, and C being mounted on a board, "in a plan view of the board (or the principal surface of the board), C is disposed between A and B" means that a straight line connecting an arbitrary point in A and an arbitrary point in B passes through a region in C in a plan view of the board. In addition, a plan view of the board (or the principal surface of the board) means that the board (or the principal surface of the board) and circuit elements mounted on the board (or the principal surface of the board) are orthographically projected on a plane parallel to the board.

In addition, in the following description, a "transmission path" refers to a transfer path including a line along which a radio frequency transmission signal propagates, an electrode directly connected to the line, a terminal directly connected to the line or the electrode, etc. Furthermore, a "reception path" refers to a transfer path including a line along which a radio frequency reception signal propagates, an electrode directly connected to the line, a terminal directly connected to the line or the electrode, etc. Furthermore, a "signal path" refers to a transfer path including a line along which a radio frequency signal propagates, an electrode directly connected to the line, a terminal directly connected to the line or the electrode, and the like.

In addition, in the following description, "A and B are connected to each other" is applied to not only the case where A and B are physically connected to each other but also the case where A and B are electrically connected to each other.

Embodiments

1. Configuration of Radio Frequency Module 1 and Communication Device 7

FIG. 1 is a diagram illustrating a circuit configuration of radio frequency module 1 and communication device 7 according to an embodiment. As illustrated in this diagram, communication device 7 includes radio frequency module 1, transfer circuit 8, RF signal processing circuits (RFICs) 51 and 52, and antennas 61 and 62.

RFIC 51 is an RF signal processing circuit that processes radio frequency signals of the second frequency band that are transmitted and received by antenna 61 and radio frequency signals of the first frequency band that are transmitted and received by antenna 62. More specifically, RFIC 51 performs signal processing, by down-conversion or the like, on a reception signal inputted through terminal 511 or 512 via a reception path of radio frequency module 1, and outputs the reception signal generated by the signal processing to a baseband signal processing circuit (not illustrated). In addition, RFIC 51 performs signal processing, by up-conversion or the like, on a transmission signal inputted from the baseband signal processing circuit, and outputs through terminal 512 the transmission signal generated by the signal processing to a transmission path of radio frequency module 1.

RFIC 52 is an RF signal processing circuit that processes radio frequency signals of the third frequency band that are transmitted and received by antenna 62. More specifically, RFIC 52 performs signal processing, by down-conversion or the like, on a reception signal inputted through terminal 521 via a reception path of transfer circuit 8, and outputs the reception signal generated by the signal processing to a baseband signal processing circuit (not illustrated). In addition, RFIC 52 performs signal processing, by up-conversion or the like, on a transmission signal inputted from the baseband signal processing circuit, and outputs the transmission signal generated by the signal processing to a transmission path (not illustrated) of transfer circuit 8.

It should be noted that RFIC 51 and RFIC 52 may be included in a single RFIC.

Antenna 61 is an antenna that emits and receives radio frequency signals of the second frequency band. Antenna 62 is an antenna that emits and receives radio frequency signals of the first frequency band and the third frequency band.

It should be noted that the first frequency band is at least a portion of an unlicensed band higher than or equal to 5 GHz. In addition, the second frequency band is at least a portion of a licensed band lower than 5 GHz. In addition, the third frequency band is at least a portion of an unlicensed band.

Antenna 61 has antenna properties that enable emitting and receiving radio frequency signals lower than 5 GHz. Antenna 62 has antenna properties that enable emitting and receiving radio frequency signals higher than or equal to 5 GHz.

The following describes an application example of the first frequency band and the second frequency band according to the embodiment.

As the first application example, the first frequency band is, for example, NR-U that is a frequency band including at least a portion of the 5.925 GHz to 7.125 GHz frequency band, or a wireless local area network (WLAN). NR-U is 5G-NR higher than or equal to 5 GHz of 3GPP, and corresponds to a U-NII communication band in the unlicensed bands stipulated by the Federal Communications Commission (FCC). 3GPP denotes the third generation partnership project, 5G denotes the fifth generation mobile communication system, and NR denotes New Radio. In addition, the second frequency band is, for example, a frequency band that includes at least a portion of the 4G-LTE and 5G-NR ultra-high band group ranging from 3.3 GHz to 5 GHz. It should be noted that the second frequency band may be any one of the 4G-LTE and 5G-NR middle band group ranging from 1.7 GHz to 2.2 GHz, the 4G-LTE and 5G-NR high band group ranging from 2.4 GHz to 2.7 GHz, and the 4G-LTE and 5G-NR low band group of 1 GHz or lower.

Next, as the second application example, the first frequency band is 4G-LTE-LAA that is a frequency band including at least a portion of the 5.15 GHz to 5.925 GHz frequency band, NR-U, or WLAN. 4G is the fourth generation mobile communication system, LTE is Long Term Evolution, and LAA is Licensed-Assisted Access. In addition, the second frequency band is, for example, equivalent to the second frequency band in the first application example.

Next, as the third application example, the first frequency band is equivalent to the first frequency band in the first application example. In addition, the second frequency band is equivalent to the first frequency band in the second application example.

Next, as the fourth application example, the first frequency band is, for example, 4G-LTE-LAA that is a frequency band including at least a portion of the 5.47 GHz to 5.925 GHz frequency band, NR-U, or WLAN. In addition, the second frequency band is, for example, 4G-LTE-LAA that is a frequency band including at least a portion of the 5.15 GHz to 5.35 GHz frequency band, NR-U, or WLAN.

In addition, according to the embodiment, the third frequency band is, for example, a frequency band including at least a portion of WLAN ranging from 5.15 GHz to 5.925 GHz or from 5.925 GHz to 7.125 GHz.

It should be noted that the third frequency band may be the WLAN 2.4 GHz band.

In addition, according to the embodiment, the modulation scheme of a signal of the first frequency band is different from the modulation scheme of a signal of the third frequency band. For this reason, even when the first frequency band and the third frequency band are in a frequency relationship in which frequencies overlap or are in proximity to each other in a frequency band higher than or equal to 5 GHz, RFIC 51 that processes a signal of the first frequency, and RFIC 52 that processes a signal of the third frequency band are different from each other.

In addition, the modulation scheme of a signal of the first frequency band may be the same as the modulation scheme of a signal of the third frequency band. In this case, the frequency range of the first frequency band is different from the frequency range of the third frequency band. In addition, in this case, RFIC 51 that processes a signal of the first frequency band and RFIC 52 that processes a signal of the third frequency band may be the same RFIC, and the antenna to which the first transfer circuit is connected may be different from the antenna to which transfer circuit 8 is connected.

It should be noted that the expression that two signals are different in modulation scheme means that the secondary modulation or the primary modulation indicated in Table 1 below is different. In addition, the expression that two signals are identical in modulation scheme means that the secondary modulation or the primary modulation indicated in Table 1 below is identical.

TABLE 1

| | Secondary modulation | Primary modulation |
|---|---|---|
| 4G LTE | SC-FDMA | QPSK 16/64/256 QAM |
| 5G NR | DFT-s-OFDM | QPSK 16/64/256 QAM |
| 5G NR | CP-OFDM | QPSK 16/64/256 QAM |
| WiFi 5 (802.11 ac) | MIMO-OFDM | 16/64/256 QAM |
| WiFi 6 (802.11 ax) | MU-MIMO-OFDM | 16/64/256/ 1024 QAM |

Radio frequency module 1 includes terminals 110 and 120, low noise amplifiers 21 and 22, power amplifier 32, filters 11 and 12, and switches 41, 42A, and 42B.

Terminal 110 is one example of a first terminal to which a signal of the first frequency band is inputted. Terminal 110 is connected to antenna 62 via switch 41.

Low noise amplifier 21 is one example of a first amplifier that amplifies a reception signal of the first frequency band that has been inputted to terminal 110. Reception low noise amplifier 21 includes an input terminal connected to filter 11, and an output terminal connected to terminal 511 of RFIC 51.

Filter 11 has, as a passband, the first frequency band, and is connected between terminal 110 and low noise amplifier 21.

Switch 41 is connected between terminal 110 and antenna 62, and connects and disconnects radio frequency module 1 and antenna 62. When switch 41 is in a conducting state, radio frequency module 1 is capable of simultaneously transferring a signal of the first frequency band and a signal of the second frequency band. In contrast, when switch 41 is in a non-conducting state, radio frequency module 1 is capable of transferring only a signal of the second frequency band.

Switch 41, terminal 110, filter 11, and low noise amplifier 21 are included in the first transfer circuit that transfers a reception signal of the first frequency band.

It should be noted that the first transfer circuit may have a circuit configuration that transfers a transmission signal of the first frequency band. In this case, the first transfer circuit further includes a power amplifier and the like.

Terminal 120 is one example of a second terminal to which a signal of the second frequency band is inputted. Terminal 120 is connected to antenna 61.

Low noise amplifier 22 is one example of a second amplifier that amplifies a reception signal of the second frequency band that has been inputted to terminal 120. Reception low noise amplifier 22 includes an input terminal connected to switch 42A, and an output terminal connected to switch 42B.

Filter 12 has, as a passband, the second frequency band, and is connected between terminal 120 and switch 42A.

Power amplifier 32 is one example of a fourth amplifier that amplifies a transmission signal of the second frequency band. Power amplifier 32 includes an input terminal connected to switch 42B, and an output terminal connected to switch 42A.

Switch 42A includes a common terminal and two selection terminals. The common terminal is connected to filter 12, one of the selection terminals is connected to power amplifier 32, and the other of the selection terminals is connected to low noise amplifier 22. Switch 42A exclusively switches the connection of the common terminal between the one of the selection terminals and the other of the selection terminals.

Switch 42B includes a common terminal and two selection terminals. The common terminal is connected to terminal 512, one of the selection terminals is connected to power amplifier 32, and the other of the selection terminals is connected to low noise amplifier 22. Switch 42B exclusively switches connection of the common terminal between the one of the selection terminals and the other of the selection terminals.

According to the above-described connection configuration of switches 42A and 42B, a reception signal of the second frequency band and a transmission signal of the second frequency band are transferred in a time division duplex (TDD) method.

It should be noted that, although filter 12 which is a TDD filter that passes both the transmission signal and the reception signal of the second frequency band is employed in the above-described configuration, a transmission filter that has, as a passband, a transmission band of the second frequency band and a reception filter that has, as a passband, a reception band of the second frequency band may be separately disposed in place of filter 12.

Terminal 120, filter 12, low noise amplifier 22, power amplifier 32, switches 42A and 42B are included in the second transfer circuit that transfers a reception signal of the second frequency band.

It should be noted that the second transfer circuit may transfer a transmission signal and a reception signal of the second frequency band in a frequency division duplex (FDD) system. In this case, a duplexer is disposed in place of filter 12 and switches 42A and 42B.

It should be noted that the second transfer circuit may have a circuit configuration that does not transfer a transmission signal of the second frequency band, and transfers only a reception signal of the second frequency band. In this case, the second transfer circuit need not include power amplifier 32 and switches 42A and 42B.

Here, the first transfer circuit and the second transfer circuit are contained in the same package. In other words, low noise amplifiers 21 and 22, power amplifier 32, filters 11 and 12, and switches 41, 42A, and 42B are disposed in the same package.

It should be noted that the state in which a plurality of circuit components are disposed in the same package is defined as (1) a state in which a plurality of circuit components are mounted on a single board via solder or an adhesive, and at least one side surface of at least one of the plurality of circuit components is entirely covered by a sealing member, or (2) a state in which a plurality of circuit components are mounted on an inner wall of a casing including a ceramic, metal, or resin member via solder or an adhesive. It should be noted that the casing is defined as an object including a bottom plate portion enclosed by a plurality of outer sides and a side wall standing on and over at least one of the plurality of outer sides.

According to the above-described configuration of radio frequency module 1 in which the first transfer circuit and the second transfer circuit are contained in the same package, it is possible to shorten both a signal line for transferring a signal of the first frequency band from radio frequency module 1 to RFIC 51 and a signal line for transferring a signal of the second frequency band from radio frequency module 1 to RFIC 51. With this, it is possible to reduce the transfer losses of signals of the unlicensed band higher than or equal to 5 GHz and signals of the licensed band lower than 5 GHz.

In addition, although the first transfer circuit and the second transfer circuit may be located in proximity to each other as a result of the first transfer circuit and the second transfer circuit being disposed in the same package, it is possible to highly precisely manage, in advance, interferences and the like when the signals of the unlicensed band higher than or equal to 5 GHz and the signals of the licensed band lower than 5 GHz are simultaneously transferred because the arrangement relation of the first transfer circuit and the second transfer circuit can be fixed in the same package. In other words, it is possible to optimize the interference properties such as isolation and intermodulation distortion between the first transfer circuit and the second transfer circuit, in a stage before radio frequency module 1 is mounted on a motherboard. Accordingly, it is possible to provide radio frequency module 1 which has a small size and in which the deterioration of the signal quality of the unlicensed band higher than or equal to 5 GHz and the licensed band lower than 5 GHz is reduced.

It should be noted that it is sufficient if low noise amplifiers 21 and 22 are disposed in the same package, among terminals 110 and 120, low noise amplifiers 21 and 22, power amplifier 32, filters 11 and 12, and switches 41, 42A, and 42B included in radio frequency module 1.

In addition, although low noise amplifiers 21 and 22 and terminals 110 and 120 are indispensable components in radio frequency module 1, filters 11 and 12, power amplifier 32, and switches 41, 42A and 42B need not necessarily be included in radio frequency module 1.

Transfer circuit 8 includes terminal 130, low noise amplifier 23, filter 13, and switch 43.

Terminal 130 is one example of a third terminal to which a signal of the third frequency band is inputted. Terminal 130 is connected to antenna 62 via switch 43.

Low noise amplifier 23 is one example of a third amplifier that amplifies a reception signal of the third frequency band that has been inputted to terminal 130. Reception low noise amplifier 23 includes an input terminal connected to filter 13, and an output terminal connected to terminal 521 of RFIC 52.

Filter 13 has, as a passband, the third frequency band, and is connected between terminal 130 and low noise amplifier 23.

Switch 43 is connected between terminal 130 and antenna 62, and connects and disconnects transfer circuit 8 and antenna 62. When switch 43 is in a conducting state, it is possible to simultaneously transfer a signal of the third frequency band and at least one of a signal of the first frequency band and a signal of the second frequency band, as well as independently transfer a signal of the third frequency band. In contrast, when switch 43 is in a non-conducting state, it is possible to transfer at least one of a signal of the first frequency band and a signal of the second frequency band in radio frequency module 1.

It should be noted that transfer circuit 8 may have a circuit configuration that transfers a transmission signal of the third frequency band. In this case, transfer circuit 8 further includes a power amplifier and the like.

According to the above-described configuration of communication device 7, it is possible to highly precisely manage, in advance, interference and the like when signals of the unlicensed band higher than or equal to 5 GHz which are transferred through the first transfer circuit and signals of the licensed band lower than 5 GHz which are transferred through the second transfer circuit are simultaneously transferred. In addition, since transfer circuit 8 can be located according to an arrangement position of RFIC 52 relative to the motherboard, it is possible to reduce the length of a signal line that connects transfer circuit 8 and RFIC 52. Accordingly, it is possible to provide communication device 7 which has a small size and in which the deterioration of the signal quality of the unlicensed band higher than or equal to 5 GHz and the licensed band lower than 5 GHz is reduced.

2. Configuration of Radio Frequency Module 1A and Communication Device 7A According to Variation 1

Figure 2:
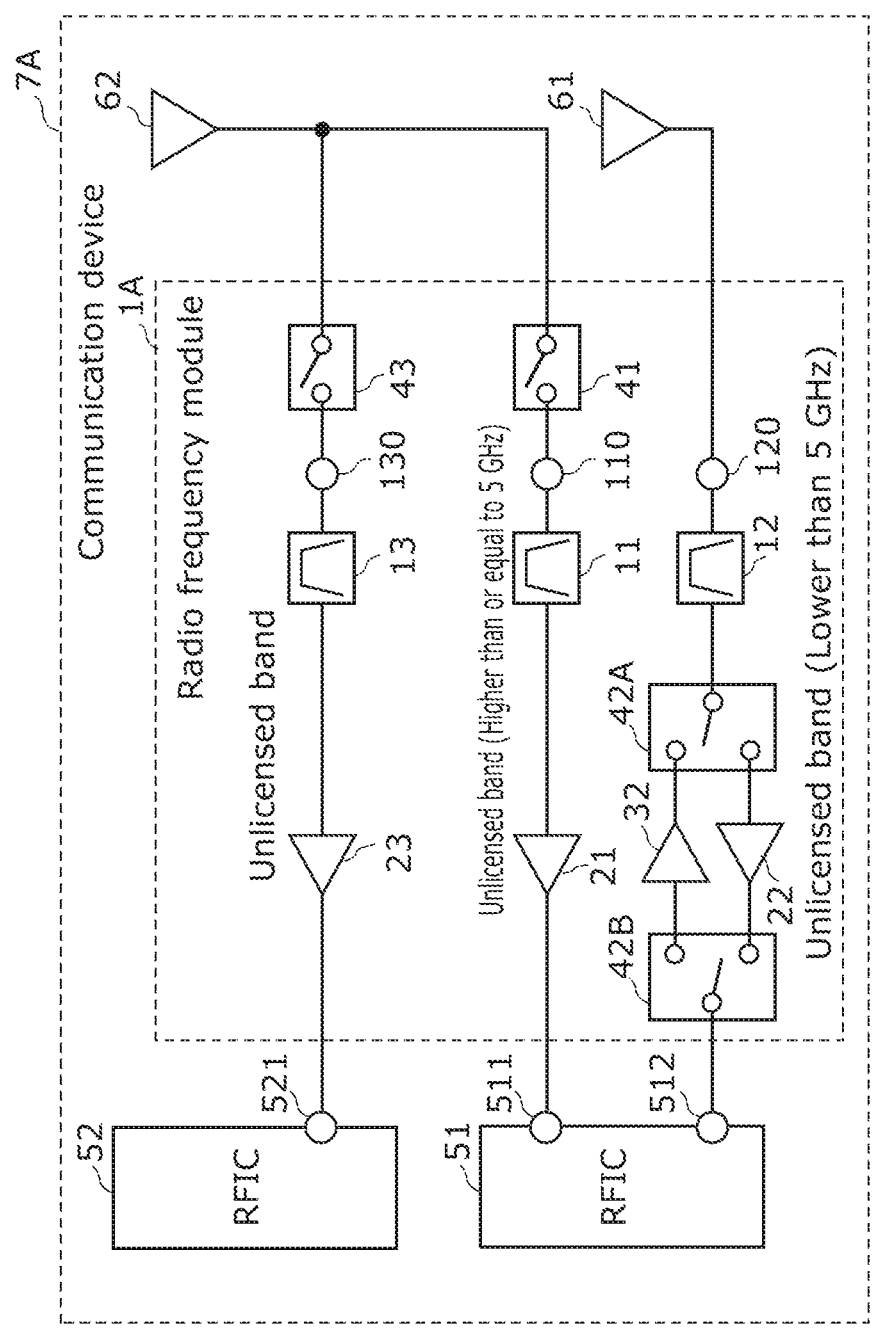
FIG. 2 is a diagram illustrating a circuit configuration of a radio frequency module and a communication device according to Variation 1 of the embodiment.

FIG. 2 is a diagram illustrating a circuit configuration of radio frequency module 1A and communication device 7A according to Variation 1 of the embodiment. As illustrated in the diagram, communication device 7A includes radio frequency module 1A, RFICs 51 and 52, and antennas 61 and 62. Radio frequency module 1A includes terminals 110, 120, and 130, low noise amplifiers 21, 22, and 23, power amplifier 32, filters 11, 12, and 13, and switches 41, 42A, 42B, and 43.

Communication device 7A according to the present variation is different from communication device 7 according to the embodiment in that radio frequency module 1A includes transfer circuit 8. Hereinafter, communication device 7A and radio frequency module 1A according to the present variation will be described. In the description, the same points as those of communication device 7 and radio frequency module 1 according to the embodiment will be omitted, and different points will be mainly described.

The first transfer circuit, the second transfer circuit, and transfer circuit 8 are contained in the same package. In other words, low noise amplifiers 21, 22, and 23, power amplifier 32, filters 11, 12, and 13, and switches 41, 42A, 42B, and 43 are disposed in the same package.

According to the above-described configuration of radio frequency module 1A in which the first transfer circuit, the second transfer circuit, and transfer circuit 8 are contained in the same package, it is possible to reduce the length of each of the signal line for transferring a signal of the first frequency band from radio frequency module 1A to RFIC 51, the signal line for transferring a signal of the second frequency band from radio frequency module 1A to RFIC 51, and the signal line for transferring a signal of the third frequency band from radio frequency module 1A to RFIC 52. As a result, it is possible to reduce the transfer loss of signals of the unlicensed band and signals of the licensed band lower than 5 GHz.

In addition, as a result of the first transfer circuit, the second transfer circuit, and transfer circuit 8 being contained in the same package, it is possible to fix the arrangement relation of these transfer circuits. It is thus possible to highly precisely manage, in advance, interference and the like when signals of the unlicensed band and signals of the licensed band lower than 5 GHz are simultaneously transferred. In other words, it is possible to optimize the interference properties such as the isolation and intermodulation distortion between the transfer circuits, in a stage before radio frequency module 1A is mounted on a motherboard. As a result, it is possible to provide radio frequency module 1A and communication device 7A which have small sizes and in which the deterioration of the signal quality of the unlicensed band and the licensed band lower than 5 GHz is reduced.

It should be noted that it is sufficient if low noise amplifiers 21, 22, and 23 are contained in the same package, among terminals 110, 120, and 130, low noise amplifiers 21, 22, and 23, power amplifier 32, filters 11, 12, and 13, and switches 41, 42A, 42B, and 43 in radio frequency module 1A.

3. Mount Configuration of Radio Frequency Module 1 and Communication Device 7

Figure 3:
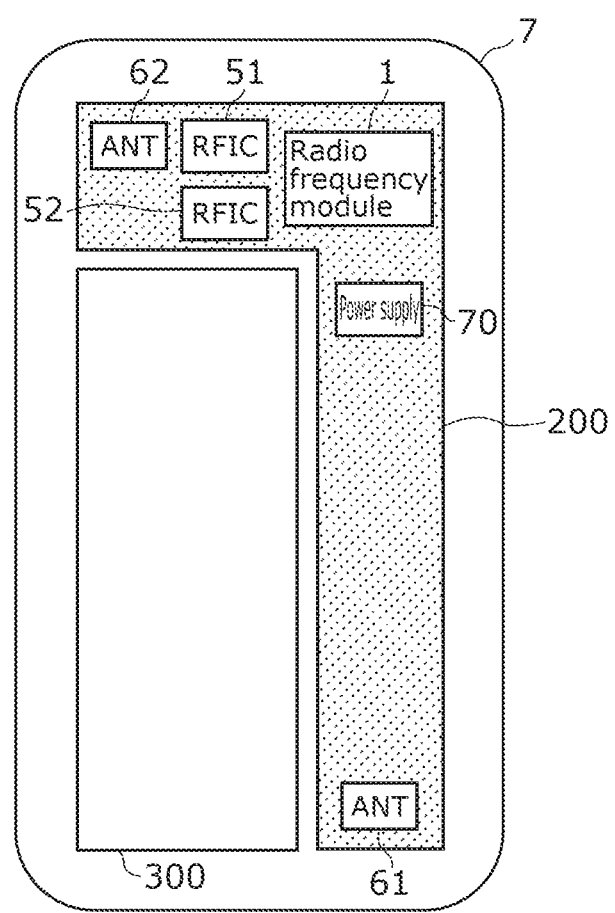
FIG. 3 is a diagram illustrating a schematic plan view showing one example of a mount configuration of the communication device according to the embodiment.

FIG. 3 is a diagram illustrating a schematic plan view showing one example of a mount configuration of communication device 7 according to the embodiment. As illustrated in the diagram, communication device 7 is, for example, a mobile terminal such as a smartphone. Motherboard 200 and motherboard 300 are disposed inside the mobile terminal. Circuit components for transferring and processing RF signals are mounted on motherboard 200. Circuit components for transferring and processing baseband signals, etc. are mounted on motherboard 300. Radio frequency module 1 according to the embodiment is mounted on motherboard 200. In addition, RFICs 51 and 52, antennas 61 and 62, and power supply 70 that supplies a voltage to the power amplifier, the low noise amplifier, the switch, and the like included in radio frequency module 1 are further mounted on motherboard 200. It should be noted that the circuit components for transferring and processing baseband signals and the like may be mounted on motherboard 200 together with the circuit components for transferring and processing RF signals. In addition, motherboard 300 need not necessarily be included in communication device 7.

More specifically, radio frequency module 1 according to the present embodiment is mounted on motherboard 200, and since radio frequency module 1 has a single-package configuration, it is possible to reduce the length of the signal line connecting radio frequency module 1 and RFIC 51.

It should be noted that radio frequency module 1A according to Variation 1 may be mounted on motherboard 200, instead of radio frequency module 1 illustrated in FIG. 3. In this case, since radio frequency module 1A has a single-package configuration, it is possible to reduce the lengths of the signal lines connecting radio frequency module 1A and RFICs 51 and 52.

4. Configuration of Radio Frequency Module 1B and Communication Device 7B According to Variation 2

Figure 4:
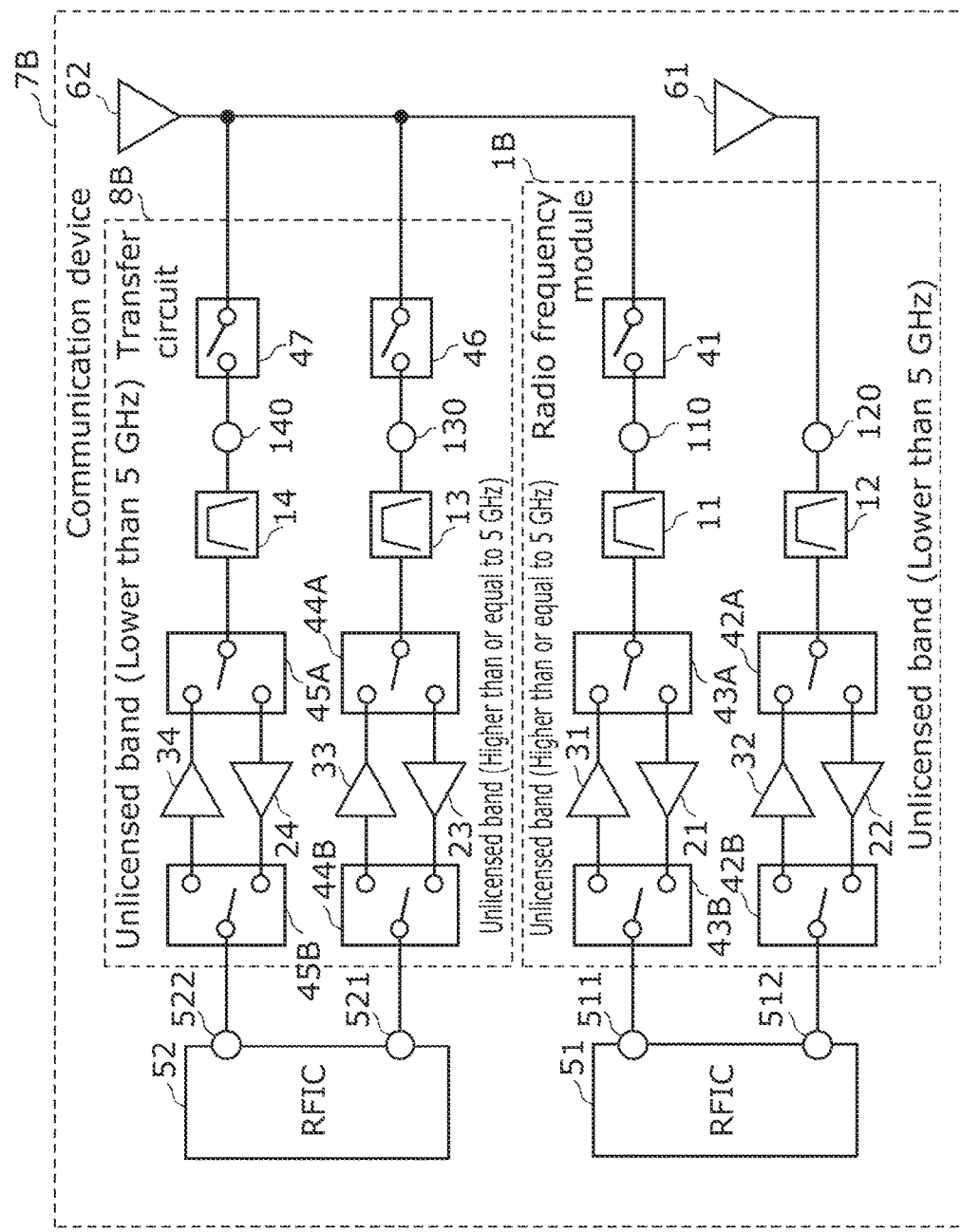
FIG. 4 is a diagram illustrating a circuit configuration of a radio frequency module and a communication device according to Variation 2 of the embodiment.

FIG. 4 is a diagram illustrating a circuit configuration of radio frequency module 1B and communication device 7B according to Variation 2 of the embodiment. As illustrated in the diagram, communication device 7B includes radio frequency module 1B, transfer circuit 8B, RFICs 51 and 52, and antennas 61 and 62. Communication device 7B according to the present variation is different from communication device 7 according to the embodiment in the configurations of radio frequency module 1B and transfer circuit 8B. Hereinafter, communication device 7B according to the present variation will be described. In the description, the same points as those of communication device 7 according to the embodiment will be omitted, and different points will be mainly described.

RFIC 51 performs signal processing, by down-conversion or the like, on a reception signal inputted through terminal 511 or 512 via a reception path of radio frequency module 1B, and outputs the reception signal generated by the signal processing to a baseband signal processing circuit (not illustrated). In addition, RFIC 51 performs signal processing, by up-conversion or the like, on a transmission signal inputted from the baseband signal processing circuit, and outputs through terminal 511 or 512 the transmission signal generated by the signal processing to a transmission path of radio frequency module 1B.

RFIC 52 performs signal processing, by down-conversion or the like, on a reception signal inputted through terminal 521 or 522 via a reception path of transfer circuit 8B, and outputs the reception signal generated by the signal processing to a baseband signal processing circuit (not illustrated). In addition, RFIC 52 performs signal processing, by up-conversion or the like, on a transmission signal inputted from the baseband signal processing circuit, and outputs through terminal 521 or 522 the transmission signal generated by the signal processing to a transmission path of transfer circuit 8B.

Radio frequency module 1B includes terminals 110 and 120, low noise amplifiers 21 and 22, power amplifiers 31 and 32, filters 11 and 12, and switches 41, 42A, 42B, 43A, and 43B.

Filter 11 has, as a passband, the first frequency band, and is connected between terminal 110 and switch 43A.

Low noise amplifier 21 is one example of a first amplifier that amplifies a reception signal of the first frequency band that has been inputted to terminal 110. Reception low noise amplifier 21 includes an input terminal connected to switch 43A, and an output terminal connected to switch 43B.

Power amplifier 31 is one example of a third amplifier that amplifies a transmission signal of the first frequency band. Power amplifier 31 includes an input terminal connected to switch 43B, and an output terminal connected to switch 43A.

Switch 43A includes a common terminal and two selection terminals. The common terminal is connected to filter 11, one of the selection terminals is connected to power amplifier 31, and the other of the selection terminals is connected to low noise amplifier 21. Switch 43A exclusively switches the connection of the common terminal between the one of the selection terminals and the other of the selection terminals.

Switch 43B includes a common terminal and two selection terminals. The common terminal is connected to terminal 511, one of the selection terminals is connected to power amplifier 31, and the other of the selection terminals is connected to low noise amplifier 21. Switch 43B exclusively switches the connection of the common terminal between the one of the selection terminals and the other of the selection terminals.

According to the above-described connection configuration of switches 43A and 43B, a reception signal of the first frequency band and a transmission signal of the first frequency band are transferred in the TDD system.

It should be noted that, although filter 11 is a TDD filter that passes both the transmission signal and the reception signal of the first frequency band, a transmission filter that has, as a passband, a transmission band of the first frequency band and a reception filter that has, as a passband, a reception band of the first frequency band may be separately provided.

Terminal 110, filter 11, low noise amplifier 21, power amplifier 31, switches 43A and 43B are included in the first transfer circuit that transfers a signal of the first frequency band.

According to the present variation, the first frequency band is, for example, a frequency band including at least a portion of NR-U ranging from 6 GHz to 7.125 GHz. In other words, the first transfer circuit transmits and receives signals of NR-U ranging from 6 GHz to 7.125 GHz in the TDD system.

Terminal 120, filter 12, low noise amplifier 22, power amplifier 32, switches 42A and 42B are included in the second transfer circuit that transfers a signal of the second frequency band.

According to the present variation, the second frequency band is, for example, a frequency band ranging from 3.3 GHz to 4.2 GHz or a frequency band ranging from 4.4 GHz to 5 GHz, each of which belongs to the ultra-high band group. For example, the frequency band ranging from 3.3 GHz to 4.2 GHz is 5G-NR n77 and the frequency band ranging from 4.4 GHz to 5 GHz is 5G-NR n79.

In other words, the second transfer circuit transmits and receives signals of 5G-NR n77 or n79 in the TDD system. In addition, the second frequency band may be 4G-LTE Band 42 ranging from 3400 MHz to 3600 MHz, 4G-LTE Band 43 ranging from 3600 MHz to 3800 MHz, 5G-NR n48 ranging from 3550 MHz to 3700 MHz, or 5G-NR n78 ranging from 3300 MHz to 3800 MHz.

Here, the first transfer circuit and the second transfer circuit are contained in the same package. In other words, terminals 110 and 120, low noise amplifiers 21 and 22, power amplifiers 31 and 32, filters 11 and 12, and switches 41, 42A, 42B, 43A, and 43B are disposed in the same package.

Transfer circuit 8B, terminals 130 and 140, low noise amplifiers 23 and 24, power amplifiers 33 and 34, filters 13 and 14, and switches 46, 47, 44A, 44B, 45A, and 45B.

Filter 13 has, as a passband, the third frequency band, and is connected between terminal 130 and switch 44A.

Low noise amplifier 23 amplifies a reception signal of the third frequency band that has been inputted to terminal 130. Reception low noise amplifier 23 includes an input terminal connected to switch 44A, and an output terminal connected to switch 44B.

Power amplifier 33 amplifies a transmission signal of the third frequency band. Power amplifier 33 includes an input terminal connected to switch 44B, and an output terminal connected to switch 44A.

Switch 44A includes a common terminal and two selection terminals. The common terminal is connected to filter 13, one of the selection terminals is connected to power amplifier 33, and the other of the selection terminals is connected to low noise amplifier 23. Switch 44A exclusively switches the connection of the common terminal between the one of the selection terminals and the other of the selection terminals.

Switch 44B includes a common terminal and two selection terminals. The common terminal is connected to terminal 521 of RFIC 52, one of the selection terminals is connected to power amplifier 33, and the other of the selection terminals is connected to low noise amplifier 23. Switch 44B exclusively switches the connection of the common terminal between the one of the selection terminals and the other of the selection terminals.

According to the above-described connection configurations of switches 44A and 44B, a reception signal of the third frequency band and a transmission signal of the third frequency band are transferred in the TDD system.

Terminal 130, filter 13, low noise amplifier 23, power amplifier 33, switches 44A and 44B are included in the third transfer circuit that transfers a signal of the third frequency band.

According to the present variation, the third frequency band is, for example, a frequency band including at least a portion of WLAN ranging from 5.15 GHz to 5.925 GHz or from 5.925 GHz to 7.125 GHz. In other words, the third transfer circuit transmits and receives signals of WLAN ranging from 5.15 GHz to 5.925 GHz or from 5.925 GHz to 7.125 GHz in the TDD system.

Filter 14 has, as a passband, the fourth frequency band, and is connected between terminal 140 and switch 45A.

Low noise amplifier 24 amplifies a reception signal of the fourth frequency band that has been inputted to terminal 140. Reception low noise amplifier 24 includes an input terminal connected to switch 45A, and an output terminal connected to switch 45B.

Power amplifier 34 amplifies a transmission signal of the fourth frequency band. Power amplifier 34 includes an input terminal connected to switch 45B, and an output terminal connected to switch 45A.

Switch 45A includes a common terminal and two selection terminals. The common terminal is connected to filter 14, one of the selection terminals is connected to power amplifier 34, and the other of the selection terminals is connected to low noise amplifier 24. Switch 45A exclusively switches connection of the common terminal between the one of the selection terminals and the other of the selection terminals.

Switch 45B includes a common terminal and two selection terminals. The common terminal is connected to terminal 522 of RFIC 52, one of the selection terminals is connected to power amplifier 34, and the other of the selection terminals is connected to low noise amplifier 24. Switch 45B exclusively switches connection of the common terminal between the one of the selection terminals and the other of the selection terminals.

According to the above-described connection configurations of switches 45A and 45B, a reception signal of the fourth frequency band and a transmission signal of the fourth frequency band are transferred in the TDD system.

Terminal 140, filter 14, low noise amplifier 24, power amplifier 34, switches 45A and 45B are included in the fourth transfer circuit that transfers a signal of the fourth frequency band.

According to the present variation, the fourth frequency band is, for example, a frequency band including at least a portion of the WLAN 2.4 GHz band. In other words, the fourth transfer circuit transmits and receives signals of the WLAN 2.4 GHz band in the TDD system.

It should be noted that, in communication device 7B according to the present variation, at least one of the third transfer circuit or the fourth transfer circuit may be contained in the same package together with the first transfer circuit and the second transfer circuit.

With the configuration of radio frequency module 1B according to the present variation, transmission or reception of a signal of the first frequency band in the first transfer circuit is synchronized with transmission or reception of a signal of the second frequency band in the second transfer circuit.

However, with the configuration of radio frequency module 1B according to the present variation, transmission or reception of a signal of the first frequency band in the first transfer circuit need not necessarily be synchronized with transmission or reception of a signal of the second frequency band in the second transfer circuit.

It should be noted that, in communication device 7B according to the present variation, the transmission power of a signal of the first frequency band in the first transfer circuit is smaller than the transmission power of a signal of the second frequency band in the second transfer circuit. In addition, the reception power of a signal of the first frequency band in the first transfer circuit is smaller than the reception power of a signal of the second frequency band in the second transfer circuit. It should be noted that the transmission power and the reception power of a signal of the first frequency band in the first transfer circuit is a power value measured at terminal 110, and the transmission power and the reception power of a signal of the second frequency band in the second transfer circuit is a power value measured at terminal 120.

In addition, according to a request for addressing a high power mobile station (i.e., high power user equipment (HPUE)), there are instances where it is required that signal power of a signal of a communication band in which the TDD system is used among the communication bands stipulated by 3GPP, which is outputted from an antenna terminal of a mobile phone or the like, be greater by 3 dB (to be 26 dBm, for example) than transmission power (23 dBm, for example) of a band in which the FDD system is used, such that a single base station can cover a wide area. For that reason, a gain may be variable according to an increase and decrease of a transmission power in low noise amplifier 21. In this case, the gain of low noise amplifier 21 is controlled by RFIC 51.

5. Arrangement Configuration of Circuit Elements of Radio Frequency Module 1B According to Variation 2

Figure 5A:
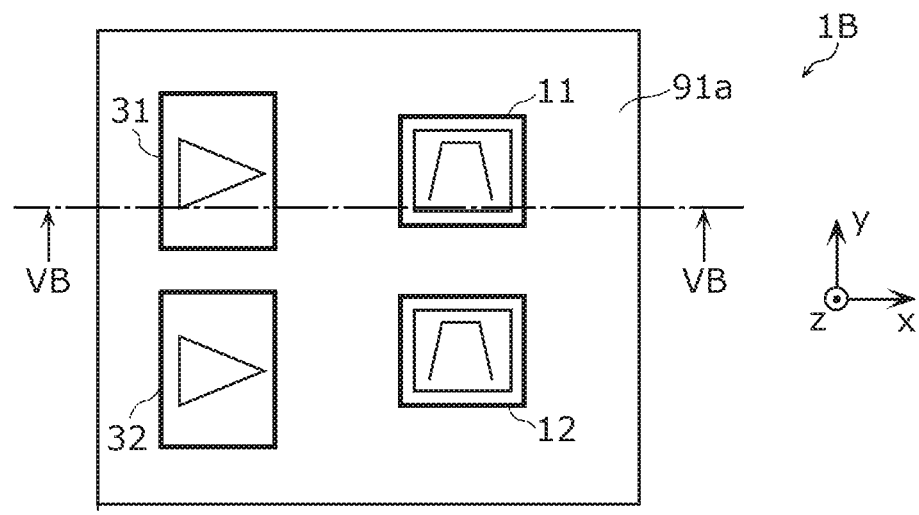
FIGS. 5AA and 5AB are schematic diagrams illustrating plan view configurations of the radio frequency module according to Variation 2.
Figure 5A:
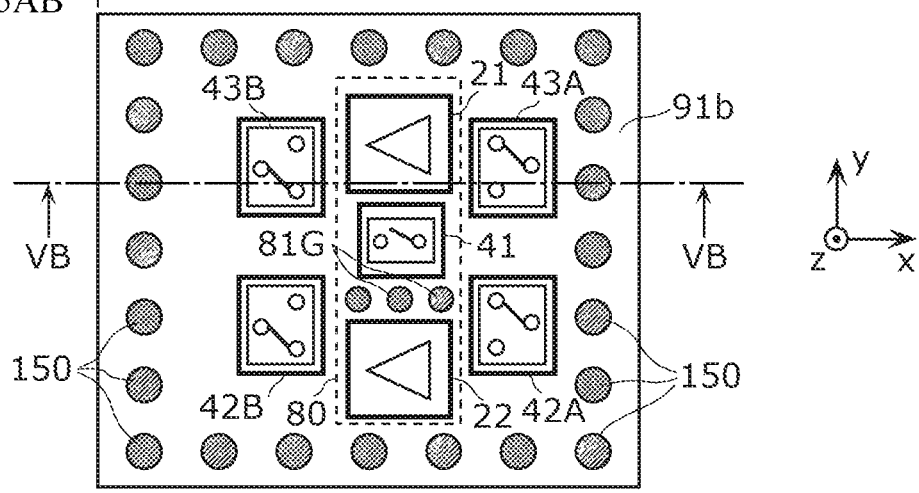
Figure 5B:
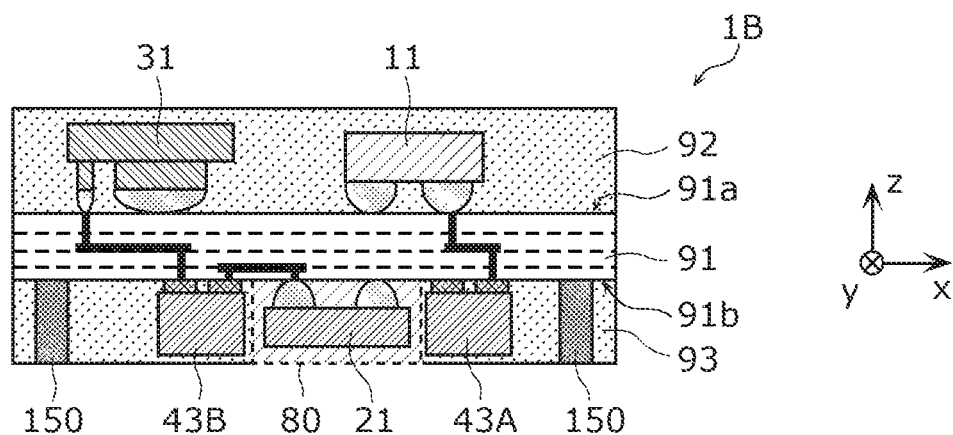
FIG. 5B is a schematic diagram illustrating a cross-sectional configuration of the radio frequency module according to Variation 2.

FIGS. 5AA and 5AB are schematic diagrams illustrating the plan view configurations of radio frequency module 1B according to Variation 2. FIG. 5B is a schematic diagram illustrating a cross-sectional configuration of radio frequency module 1B according to Variation 2. More specifically, FIG. 5B is a cross-sectional view taken along lines VB-VB of FIGS. 5AA and 5AB. It should be noted that FIG. 5AA illustrates a layout of the circuit elements when, of principal surfaces 91a and 91b located on opposite sides of module board 91, principal surface 91a is viewed from the z-axis positive side. Meanwhile, FIG. 5AB illustrates a perspective view of the layout of the circuit elements when principal surface 91b is viewed from the z-axis positive side. It should be noted that, although each of the circuit components illustrated in FIGS. 5AA and 5AB is attached with a symbol indicating a function of the circuit component such that the arrangement relation of circuit components are readily understood, such a symbol is not actually attached to radio frequency module 1B.

In FIGS. 5AA and 5AB and FIG. 5B, the arrangement configurations of the circuit elements included in the circuit of radio frequency module 1B illustrated in FIG. 4 are illustrated in detail.

As illustrated in FIGS. 5AA and 5AB and FIG. 5B, radio frequency module 1B according to Variation 2 further includes module board 91, resin components 92 and 93, external-connection terminal 150, and ground terminal 81G in addition to the circuit configuration illustrated in FIG. 4.

Module board 91 is a board which includes principal surface 91a (a first principal surface) and principal surface 91b (a second principal surface) on opposite sides thereof, and on which a first transfer circuit and a second transfer circuit are mounted. As module board 91, for example, a low temperature co-fired ceramic (LTCC) board having a stacked structure including a plurality of dielectric layers, a high temperature co-fired ceramic (HTCC) board, a component built-in board, a board including a redistribution layer (RDL), or a printed board or the like is used.

Resin component 92 is disposed on principal surface 91a of module board 91, and covers a portion of the above-described transfer circuits and principal surface 91a of module board 91. Resin component 92 has a function of ensuring reliability such as mechanical strength and moisture resistance of the circuit elements included in the above-described transfer circuits. Resin component 93 is disposed on principal surface 91b of module board 91, and covers a portion of the above-described transfer circuits and principal surface 91b of module board 91. Resin component 93 has a function of ensuring reliability such as mechanical strength and moisture resistance of the circuit elements included in the above-described transfer circuits. It should be noted that resin components 92 and 93 are not indispensable components for the radio frequency module according to the present disclosure.

As illustrated in FIGS. 5AA and 5AB and FIG. 5B, in radio frequency module 1B according to the present variation, power amplifiers 31 and 32 and filters 11 and 12 are disposed on principal surface 91a (the first principal surface) of module board 91. Meanwhile, reception low noise amplifiers 21 and 22, and switches 41, 42A, 42B, 43A, and 43B are disposed on principal surface 91b (the second principal surface) of module board 91.

External-connection terminals 150 are disposed on principal surface 91b. Radio frequency module 1B exchanges electrical signals with a motherboard disposed on the z-axis negative side of radio frequency module 1B via the plurality of external-connection terminals 150. In addition, one or some of the plurality of external-connection terminals 150 are set to the ground potential of the motherboard.

Here, reception low noise amplifiers 21 and 22, and switches 41, 42A, 42B, 43A, and 43B which are easy to reduce the heights are disposed on principal surface 91b, of principal surfaces 91a and 91b, which faces the motherboard. According to this configuration, it is possible to reduce the height of radio frequency module 1B as a whole. In addition, the plurality of external-connection terminals 150 that are applied as ground electrodes are disposed in the vicinity of the outer periphery of reception low noise amplifiers 21 and 22 that significantly affect the reception sensitivity of the reception circuit. As a result, it is possible to reduce the deterioration of the reception sensitivity of the reception circuit.

In addition, the configuration in which low noise amplifiers 21 and 22 are both disposed on principal surface 91b makes it possible to reduce the lengths of lines between external signal terminals (not illustrated) and low noise amplifiers 21 and 22, and thus is more effective in view of reducing the deterioration of the reception sensitivity.

In addition, as illustrated in FIG. 5AB, low noise amplifiers 21 and 22 and switch 41 may be included in a single semiconductor IC 80. In addition, semiconductor IC 80 may include switches 42A, 42B, 43A, and 43B. In addition, semiconductor IC 80 may include only low noise amplifiers 21 and 22 among low noise amplifiers 21 and 22 and switches 41, 42A, 42B, 43A, and 43B.

Semiconductor IC 80 is configured by, for example, a complementary metal oxide semiconductor (CMOS). More specifically, semiconductor IC 80 is fabricated by a silicon on insulator (SOI) processing. With this, it is possible to manufacture semiconductor IC 80 at a low manufacturing cost. It should be noted that semiconductor IC 80 may include at least one of GaAs, SiGe, or GaN. With this, it is possible to output a radio frequency signal having a high-quality amplification performance and noise performance.

As a result of using semiconductor IC 80 in radio frequency module 1B, it is possible to reduce the area of principal surface 91*b*, and further possible to make a top face of semiconductor IC 80 thinner by grinding the top face from the z-axis negative side. As a result, it is possible to further reduce the size and the height of radio frequency module 1B.

In addition, as illustrated in FIG. 5AB, in a plan view of principal surface 91*b*, ground terminals 81G may be disposed between low noise amplifier 21 and low noise amplifier 22.

According to the above-described configuration, mutual interference caused by reception signals outputted from low noise amplifiers 21 and 22 is reduced by the electromagnetic field shielding function of ground terminal 81G. As a result, it is possible to improve isolation between the first transfer circuit and the second transfer circuit.

In addition, as illustrated in FIG. 5AB, in a plan view of principal surface 91*b*, switch 41 may be disposed between low noise amplifier 21 and low noise amplifier 22.

According to the above-described configuration, since switch 41 that includes a conductive member intervenes, it is possible to ensure a distance between low noise amplifier 21 and low noise amplifier 22. As a result, it is possible to improve isolation between the first transfer circuit and the second transfer circuit. In addition, when the transmission or reception of a signal of the first frequency band in the first transfer circuit and transmission or reception of a signal of the second frequency band in the second transfer circuit are performed asynchronously, it is important to pay attention to mutual interference, and thus the configuration in which switch 41 intervenes between low noise amplifier 21 and low noise amplifier 22 is useful.

In addition, although not illustrated in FIG. 5AB, in a plan view of principal surface 91*b*, a control line that transfers a control signal for controlling at least one of power amplifier 31 or power amplifier 32 may be disposed between low noise amplifier 21 and low noise amplifier 22. The above-described control line transfers a digital control signal, for example.

According to the-above described configuration, mutual interference caused by reception signals outputted from low noise amplifiers 21 and 22 is reduced by the intervention of the conductive control line. As a result, it is possible to improve isolation between the first transfer circuit and the second transfer circuit. In addition, when the transmission or reception of a signal of the first frequency band in the first transfer circuit and transmission or reception of a signal of the second frequency band in the second transfer circuit is performed asynchronously, it is important to pay attention to mutual interference, and thus the configuration in which the control line intervenes between low noise amplifier 21 and low noise amplifier 22 is useful.

In addition, as illustrated in FIG. 5AA, power amplifier 31 or 32 may be mounted on principal surface 91*a* (the first principal surface).

Power amplifiers 31 and 32 are components that generate a large amount of heat among the circuit components included in radio frequency module 1B. In order to improve the heat dissipation property of radio frequency module 1B, it is important to dissipate heat generated by power amplifiers 31 and 32 to the motherboard through a heat dissipation path having a small thermal resistance. If power amplifiers 31 and 32 are mounted on principal surface 91*b*, the electrode lines connected to power amplifiers 31 and 32 are disposed on principal surface 91*b*. For that reason, as the heat dissipation path, a heat dissipation path that passes though only a planar line pattern (along the xy plane direction) on principal surface 91*b* is included. The above-described planar line pattern is formed using a metal thin film, and thus has a large thermal resistance. For that reason, when power amplifiers 31 and 32 are disposed on principal surface 91*b*, the heat dissipation property is decreased.

In contrast, when power amplifiers 31 and 32 are mounted on principal surface 91*a*, it is possible to connect power amplifiers 31 and 32 to external-connection terminals 150 via penetrating via conductors that penetrate through module board 91 between principal surface 91*a* and principal surface 91*b*. As a result, it is possible to exclude a heat dissipation path that passes through only the planar line pattern along the xy plane direction which has a large thermal resistance, from among the lines in module board 91, as the heat dissipation paths for power amplifiers 31 and 32. It is thus possible to provide radio frequency module 1B having an improved heat dissipation properties for dissipating heat from power amplifiers 31 and 32 to the motherboard.

In addition, as illustrated in FIGS. 5AA and 5AB, power amplifiers 31 and 32 are disposed on principal surface 91*a*, and low noise amplifiers 21 and 22 are disposed on principal surface 91*b*. According to the-above described configuration, power amplifiers 31 and 32 and low noise amplifiers 21 and 22 are arranged with module board 91 interposed therebetween, and thus it is possible to improve the isolation between the transmission side and the reception side.

Figure 5C:
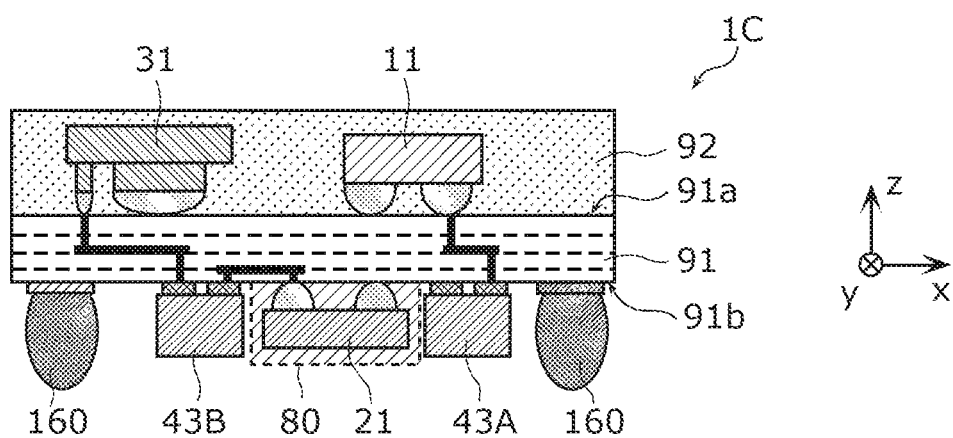
FIG. 5C is a schematic diagram illustrating a cross-sectional configuration of a radio frequency module according to Variation 3.

It should be noted that external-connection terminals 150 may be columnar electrodes that penetrate through resin component 93 in the z-axis direction as illustrated in FIGS. 5AA and 5AB and FIG. 5B, or may be bump electrodes 160 formed on principal surface 91*b* as in radio frequency module 1C according to Variation 3 as illustrated in FIG. 5C. When external-connection terminals 150 are bump electrodes 160 as illustrated in FIG. 5C, resin component 93 is not disposed on principal surface 91*b*.

In addition, in radio frequency module 1B according to the present variation, external-connection terminals 150 may be disposed on principal surface 91*a*.

6. Arrangement Configuration of Circuit Elements of Radio Frequency Module 1D According to Variation 4

Figure 6A:
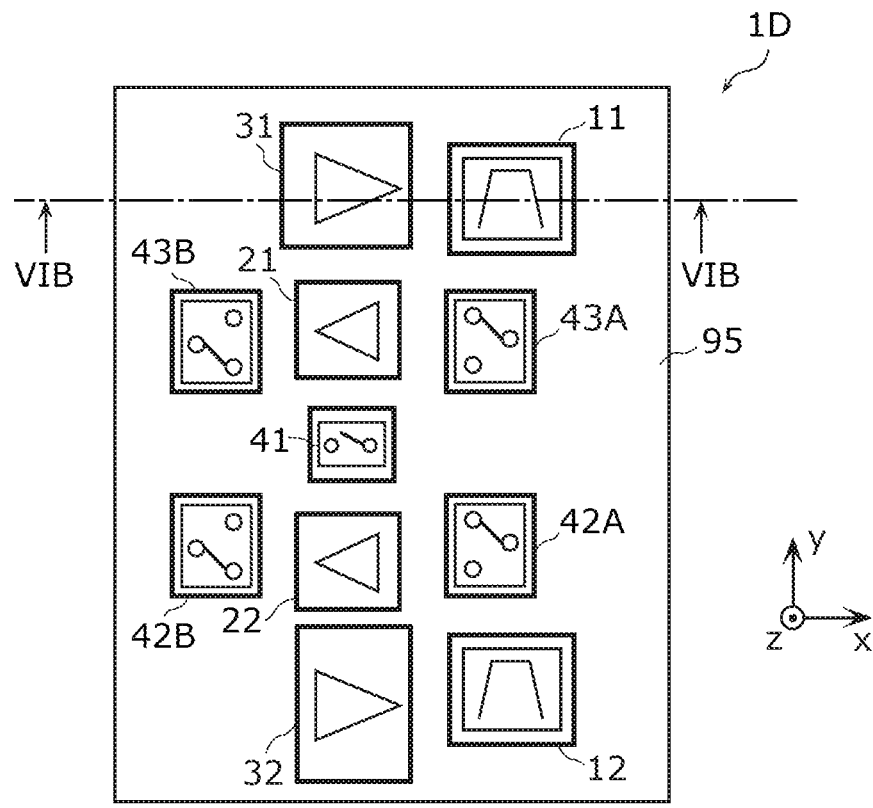
FIG. 6A is a schematic diagram illustrating a plan view configuration of the radio frequency module according to Variation 4.
Figure 6B:
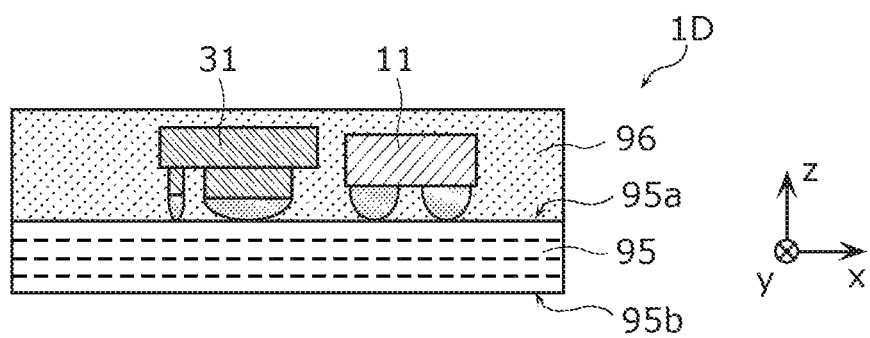
FIG. 6B is a schematic diagram illustrating a cross-sectional configuration of the radio frequency module according to Variation 4.

FIG. 6A is a schematic diagram illustrating a plan view configuration of radio frequency module 1D according to Variation 4. FIG. 6B is a schematic diagram illustrating a cross-sectional configuration of radio frequency module 1D according to Variation 4. More specifically, FIG. 6B is a cross-sectional view taken along line VIB-VIB of FIG. 6A. It should be noted that FIG. 6A illustrates a layout of the circuit elements when, of principal surfaces 95*a* and 95*b* located on opposite sides of module board 95, principal surface 95*a* is viewed from the z-axis positive side. It should be noted that, although each of the circuit components illustrated in FIG. 6A is attached with a symbol indicating a function of the circuit component such that the arrangement relation of circuit components are readily understood, such a symbol is not actually attached to radio frequency module 1D.

In FIG. 6A and FIG. 6B, the arrangement configurations of the circuit elements included in the circuit of radio frequency module 1B illustrated in FIG. 4 are illustrated in detail.

As illustrated in FIG. 6A and FIG. 6B, radio frequency module 1D according to Variation 4 includes module board 95 and resin component 96 in addition to the circuit configuration illustrated in FIG. 4. Radio frequency module 1D according to the present variation is different from radio frequency module 1B according to Variation 2 as illustrated in FIG. 5AA, FIG. 5AB, and FIG. 5B, in that circuit components included in radio frequency module 1D are collectively disposed on one (principal surface 95a) surface of module board 95. Hereinafter, radio frequency module 1D according to the present variation will be described. In the description, the same points as those of radio frequency module 1B according to Variation 2 as illustrated in FIG. 5AA, FIG. 5AB, and FIG. 5B will be omitted, and different points will be mainly described.

Module board 95 is a board which includes principal surface 95a and principal surface 95b, and on which a first transfer circuit and a second transfer circuit are mounted. As module board 95, for example, an LTCC board having a stacked structure including a plurality of dielectric layers, an HTCC board, a component built-in board, a board including an RDL, or a printed board or the like is used.

Resin component 96 is disposed on principal surface 95a of module board 95, and covers the above-described transfer circuits and principal surface 95a. Resin component 96 has a function of ensuring reliability such as mechanical strength and moisture resistance of the circuit elements included in the above-described transfer circuits.

As illustrated in FIG. 6A and FIG. 6B, in radio frequency module 1D according to the present variation, power amplifiers 31 and 32, filters 11 and 12, low noise amplifiers 21 and 22, switches 41, 42A, 42B, 43A, and 43B are disposed on principal surface 95a of module board 95. Meanwhile, circuit components are not mounted on principal surface 95b of module board 95.

According to the above-described configuration, the circuit components included in radio frequency module 1D are mounted on a single-side surface, and thus it is possible to improve the heat dissipation property for dissipating heat generated by power amplifiers 31 and 32.

It should be noted that, in a plan view of module board 95, power amplifier 31 and power amplifier 32 may be disposed with at least one of low noise amplifiers 21 or 22 interposed therebetween, as illustrated in FIG. 6A. According to the above-described arrangement, power amplifier 31 and power amplifier 32 can be further spaced away from each other. As a result, it is possible to inhibit a temperature increase due to heat generated by power amplifiers 31 and 32.

In particular, when the transmission of a signal of the first frequency band in the first transfer circuit and the transmission of a signal of the second frequency band in the second transfer circuit are performed asynchronously, there are instances where power amplifiers 31 and 32 operate simultaneously, and thus heat dissipation measures are important. For this reason, the above-described arrangement is useful.

7. Radio Frequency Module According to Variation 5 and Variation 6

A radio frequency module according to Variation 5 of the embodiment may include: a first terminal to which a signal of a first frequency band is inputted, the first frequency band being at least a portion of an unlicensed band higher than or equal to 5 GHz; a second terminal to which a signal of a second frequency band is inputted, the second frequency band being at least a portion of the unlicensed band higher than or equal to 5 GHz; a first amplifier configured to amplify a signal of the first frequency band inputted to the first terminal; and a second amplifier configured to amplify a signal of the second frequency band inputted to the second terminal. In the above-described radio frequency module, the first amplifier and the second amplifier may be disposed in one package.

The radio frequency module according to the present variation is different from radio frequency module 1 according to the embodiment in that the transfer circuit including terminal 120, low noise amplifier 22, power amplifier 32, filter 12, and switches 42A and 42B illustrated in FIG. 1 is a circuit that transfers a signal of an unlicensed band higher than or equal to 5 GHz.

In addition, in the present variation, antenna 61 has, for example, antenna properties that enable emitting and receiving a radio frequency signal ranging from 5.15 GHz to 5.925 GHz, and antenna 62 has, for example, antenna properties that enable emitting and receiving a radio frequency signal ranging from 5.15 GHz to 7.125 GHz and 2.4 GHz.

According to the-above described configuration, it is possible to reduce the lengths of both of the signal line for transferring a signal of the first frequency band from the radio frequency module to RFIC 51 and the signal line for transferring a signal of the second frequency band from the radio frequency module to RFIC 51. With this, it is possible to reduce the transfer loss of signals of the unlicensed band higher than or equal to 5 GHz. In addition, since the arrangement relation of the first transfer circuit and the second transfer circuit can be fixed in the same package, it is possible to highly precisely manage, in advance, interference and the like when two signals of the unlicensed band higher than or equal to 5 GHz are simultaneously transferred. Accordingly, it is possible to provide a radio frequency module which has a small size and in which the deterioration of the signal quality of the unlicensed band higher than or equal to 5 GHz is reduced.

In addition, a radio frequency module according to Variation 6 of the embodiment may include: a first terminal to which a signal of a first frequency band is inputted, the first frequency band being at least a portion of a wireless local area network (WLAN) ranging from 5.15 GHz to 5.925 GHz or from 5.925 GHz to 7.125 GHz; a second terminal to which a signal of a second frequency band is inputted, the second frequency band being at least a portion of NR-U ranging from 6 GHz to 7.125 GHz, the NR-U denoting new radio unlicensed; a first amplifier configured to amplify a signal of the first frequency band inputted to the first terminal; and a second amplifier configured to amplify a signal of the second frequency band inputted to the second terminal. In the above-described radio frequency module, the first amplifier and the second amplifier may be disposed in one package.

In addition, a radio frequency module according to Variation 6 of the embodiment may include: a first terminal to which a signal of a first frequency band is inputted, the first frequency band being at least a portion of a wireless local area network (WLAN) ranging from 5.15 GHz to 5.925 GHz or from 5.925 GHz to 7.125 GHz; a second terminal to which a signal of a second frequency band is inputted, the second frequency band being at least a portion of NR-U ranging from 6 GHz to 7.125 GHz, the NR-U denoting new radio unlicensed; a first amplifier configured to amplify a signal of the first frequency band inputted to the first terminal; and a second amplifier configured to amplify a signal of the second frequency band inputted to the second terminal. In the above-described radio frequency module, the first amplifier and the second amplifier may be disposed in one package.

The radio frequency module according to the present variation is different from radio frequency module 1 according to the embodiment in that the transfer circuit including terminal 110, low noise amplifier 21, and filter 11 illustrated in FIG. 1 is a circuit that transfers a signal of WLAN ranging from 5.15 GHz to 5.925 GHz or from 5.925 GHz to 7.125 GHz and a transfer circuit including terminal 120, low noise amplifier 22, power amplifier 32, filter 12, and switches 42A and 42B is a circuit that transfers a signal of NR-U ranging from 6 GHz to 7.125 GHz.

According to the-above described configuration, it is possible to reduce the lengths of both of the signal line for transferring a signal of the first frequency band from the radio frequency module to RFIC 51 and the signal line for transferring a signal of the second frequency band from the radio frequency module to RFIC 51. As a result, it is possible to reduce the transfer loss of signals of WLAN ranging from 5.15 GHz to 5.925 GHz or from 5.925 GHz to 7.125 GHz, and NR-U ranging from 6 GHz to 7.125 GHz. In addition, since the arrangement relation between the first transfer circuit and the second transfer circuit can be fixed in the same package, it is possible to highly precisely manage, in advance, the interference and the like when two signals of WLAN ranging from 5.15 GHz to 5.925 GHz or from 5.925 GHz to 7.125 GHz, and NR-U ranging from 6 GHz to 7.125 GHz are simultaneously transferred. As a result, it is possible to provide a radio frequency module which has a small size and in which the deterioration of the signal quality of each of WLAN ranging from 5.15 GHz to 5.925 GHz and from 5.925 GHz to 7.125 GHz and NR-U ranging from 6 GHz to 7.125 GHz is reduced.

As described above, radio frequency module 1 according to the embodiment includes: terminal 110 to which a signal of a first frequency band is inputted, the first frequency band being at least a portion of an unlicensed band higher than or equal to 5 GHz; terminal 120 to which a signal of a second frequency band is inputted, the second frequency band being at least a portion of a licensed band lower than 5 GHz; low noise amplifier 21 configured to amplify a signal of the first frequency band inputted to terminal 110; and low noise amplifier 22 configured to amplify a signal of the second frequency band inputted to terminal 120. In the above-described radio frequency module 1, low noise amplifier 21 and low noise amplifier 22 are disposed in one package.

According to the-above described configuration, it is possible to reduce the lengths of both of the signal line for transferring a signal of the first frequency band from radio frequency module 1 to RFIC 51 and the signal line for transferring a signal of the second frequency band from radio frequency module 1 to RFIC 51. With this, it is possible to reduce the transfer loss of signals of the unlicensed band higher than or equal to 5 GHz and signals of the licensed band lower than 5 GHz. In addition, although the circuit that transfers a signal of the first frequency band (i.e., the first transfer circuit) and the circuit that transfers a signal of the second frequency band (i.e., the second transfer circuit) may be located in proximity to each other, it is possible to highly precisely manage, in advance, the interference and the like when signals of the unlicensed band higher than or equal to 5 GHz and signals of the licensed band lower than 5 GHz are simultaneously transferred because the arrangement relation of the first transfer circuit and the second transfer circuit can be fixed in the same package. In other words, it is possible to optimize the interference properties such as isolation and intermodulation distortion between the first transfer circuit and the second transfer circuit, in a stage before radio frequency module 1 is mounted on a motherboard. Accordingly, it is possible to provide radio frequency module 1 which has a small size and in which deterioration of the signal quality of the unlicensed band higher than or equal to 5 GHz and the licensed band lower than 5 GHz is reduced.

In addition, the first frequency band may be one of (i) a frequency band including at least a portion of NR-U ranging from 6 GHz to 7.125 GHz and (ii) a frequency band including at least a portion of Band 46 ranging from 5.15 GHz to 5.925 GHz of 4G-LTE-LAA, the NR-U denoting new radio unlicensed, the 4G denoting a fourth generation mobile communication system, the LTE denoting long term evolution, the LAA denoting licensed-assisted access.

In addition, radio frequency module 1A according to Variation 1 may further include, in addition to the structural components that the above-described radio frequency module 1 includes, terminal 130 to which a signal of a third frequency band is inputted, the third frequency band being at least a portion of an unlicensed band; and low noise amplifier 23 configured to amplify a signal of the third frequency band inputted to terminal 130. In the above-described radio frequency module 1A, (i) a frequency range of the first frequency band may be different from a frequency range of the third frequency band, or (ii) a modulation scheme of a signal of the first frequency band inputted to terminal 110 may be different from a modulation scheme of a signal of the third frequency band inputted to terminal 130, and low noise amplifier 23 may be disposed in the above-described one package.

According to the-above described configuration, it is possible to reduce the lengths of: the signal line for transferring a signal of the first frequency band from radio frequency module 1A to RFIC 51; the signal line for transferring a signal of the second frequency band from radio frequency module 1A to RFIC 51; and the signal line for transferring a signal of the third frequency band from radio frequency module 1A to RFIC 52. As a result, it is possible to reduce transfer loss of signals of the unlicensed band and signals of the licensed band lower than 5 GHz.

In addition, the third frequency band may include at least a portion of a wireless local area network (WLAN) ranging from 5.15 GHz to 5.925 GHz or from 5.925 GHz to 7.125 GHz.

In addition, radio frequency module 1B according to Variation 2 may further include: power amplifier 31 configured to amplify a transmission signal of the first frequency band; and power amplifier 32 configured to amplify a transmission signal of the second frequency band. In the above-described radio frequency module 1B, low noise amplifier 21 may be configured to amplify a reception signal of the first frequency band, low noise amplifier 22 may be configured to amplify a reception signal of the second frequency band, a reception signal of the first frequency band and a transmission signal of the first frequency band may be transferred in a time division duplex (TDD) method, and a reception signal of the second frequency band and a transmission signal of the second frequency band may be transferred in the TDD method.

In addition, in radio frequency module 1B according to Variation 2, a signal of the first frequency band and a signal of the second frequency band may be transferred asynchronously.

In addition, radio frequency module 1B according to Variation 2 may further include: module board 91 including principal surface 91a and principal surface 91b on opposite sides of module board 91; and external-connection terminal 150 disposed on principal surface 91b. In the above-described radio frequency module 1B, low noise amplifier 21 and low noise amplifier 22 may be disposed on principal surface 91b.

According to the-above described configuration, low noise amplifiers 21 and 22 which are easy to reduce the height are disposed on principal surface 91b that faces a motherboard, of principal surfaces 91a and 91b. According to this configuration, it is possible to reduce the height of radio frequency module 1B as a whole. In addition, the plurality of external-connection terminals 150 that are applied as ground electrodes can be disposed in the vicinity of the outer periphery of reception low noise amplifiers 21 and 22 that significantly affect the reception sensitivity of the reception circuit. As a result, it is possible to reduce the deterioration of the reception sensitivity of the reception circuit.

In addition, low noise amplifier 21 and low noise amplifier 22 may be included in a single semiconductor IC 80.

With this, as a result of using semiconductor IC 80 in radio frequency module 1B, it is possible to reduce the area of principal surface 91b, and further possible to make a top face of semiconductor IC 80 thinner by grinding the top face from the z-axis negative side. As a result, it is possible to further reduce the size and the height of radio frequency module 1B.

In addition, in a plan view of principal surface 91b, ground terminal 81G may be disposed between low noise amplifier 21 and low noise amplifier 22.

According to the-above described configuration, mutual interference caused by reception signals outputted from low noise amplifiers 21 and 22 is reduced by the electromagnetic field shielding function of ground terminal 81G. As a result, it is possible to improve the isolation between the first transfer circuit and the second transfer circuit.

In addition, power amplifier 31 and power amplifier 32 may be disposed on principal surface 91a.

According to this configuration, it is possible to connect power amplifiers 31 and 32 to external-connection terminals 150 via a penetrating via conductor that penetrates through module board 91 between principal surface 91a and principal surface 91b. As a result, it is possible to exclude a heat dissipation path that passes through only the planar line pattern along the xy plane direction which has a large thermal resistance, from among the lines in module board 91, as the heat dissipation paths for power amplifiers 31 and 32. It is thus possible to provide radio frequency module 1B having an improved heat dissipation property for dissipating heat from power amplifiers 31 and 32 to the motherboard.

In addition, in a plan view of principal surface 91b, a control line for controlling at least one of power amplifier 31 or power amplifier 32 may be disposed between low noise amplifier 21 and low noise amplifier 32.

According to the-above described configuration, mutual interference caused by reception signals outputted from low noise amplifiers 21 and 12 is reduced by the intervention of the conductive control line. As a result, it is possible to improve the isolation between the first transfer circuit and the second transfer circuit.

In addition, radio frequency module 1D according to Variation 4 may further include module board 95 including principal surfaces 95a and 95b on opposite sides of module board 95, and low noise amplifiers 21 and 22 and power amplifiers 31 and 32 may be disposed on principal surface 95a.

According to the above-described configuration, the circuit components included in radio frequency module 1D are mounted on a single-side surface, and thus it is possible to improve the heat dissipation property for dissipating heat generated by power amplifiers 31 and 32.

In addition, in radio frequency module 1D according to Variation 4, in a plan view of module board 95, at least one of low noise amplifiers 21 or 22 may be interposed between power amplifier 31 and power amplifier 32.

According to the above-described arrangement, power amplifier 31 and power amplifier 32 can be further spaced away from each other, and thus it is possible to inhibit a temperature increase due to heat generated by power amplifiers 31 and 32.

In addition, the radio frequency module according to Variation 5 includes: a first terminal to which a signal of a first frequency band is inputted, the first frequency band being at least a portion of an unlicensed band higher than or equal to 5 GHz; a second terminal to which a signal of a second frequency band is inputted, the second frequency band being at least a portion of the unlicensed band higher than or equal to 5 GHz; a first amplifier configured to amplify a signal of the first frequency band inputted to the first terminal; and a second amplifier configured to amplify a signal of the second frequency band inputted to the second terminal. In the above-described radio frequency module according to Variation 5, the first amplifier and the second amplifier are disposed in one package.

According to the-above described configuration, it is possible to reduce the transfer loss of signals of the unlicensed band higher than or equal to 5 GHz. In addition, since the arrangement relation of the first transfer circuit and the second transfer circuit can be fixed in the same package, it is possible to highly precisely manage, in advance, interference, etc. when two signals of the unlicensed band higher than or equal to 5 GHz are simultaneously transferred. Accordingly, it is possible to provide a radio frequency module which has a small size and in which the deterioration of the signal quality of the unlicensed band higher than or equal to 5 GHz is reduced.

In addition, the radio frequency module according to Variation 6 includes: a first terminal to which a signal of a first frequency band is inputted, the first frequency band being at least a portion of a wireless local area network (WLAN) ranging from 5.15 GHz to 5.925 GHz or from 5.925 GHz to 7.125 GHz; a second terminal to which a signal of a second frequency band is inputted, the second frequency band being at least a portion of NR-U ranging from 6 GHz to 7.125 GHz, the NR-U denoting new radio unlicensed; a first amplifier configured to amplify a signal of the first frequency band inputted to the first terminal; and a second amplifier configured to amplify a signal of the second frequency band inputted to the second terminal. In the above-described radio frequency module according to Variation 6, the first amplifier and the second amplifier are disposed in one package.

According to the-above described configuration, it is possible to reduce the transfer loss of signals of WLAN and NR-U. In addition, since the arrangement relation of the first transfer circuit and the second transfer circuit can be fixed in the same package, it is possible to highly precisely manage, in advance, interference, etc. when two signals of WLAN and NR-U are simultaneously transferred. Accordingly, it is possible to provide a radio frequency module which has a small size and in which the deterioration of the signal quality of the WLAN and NR-U is reduced.

Other Embodiments

Although the radio frequency module and the communication device according to the embodiment of the present disclosure have been described above based on the embodiment and variations of the embodiment, the present disclosure is not limited to the foregoing embodiment and the variations of the embodiments. The present disclosure also encompasses other embodiments achieved by combining arbitrary structural components in the above-described embodiment and the variations of the embodiment, variations resulting from various modifications to the above-described embodiment that may be conceived by those skilled in the art without departing from the essence of the present disclosure, and various devices that include the radio frequency module and the communication device according to the present disclosure.

In addition, for example, in the radio frequency module and the communication device according to the above-described embodiment and the variation thereof, a matching element such as an inductor and a capacitor and a switching circuit may be connected between the structural components. It should be noted that the inductor may include a line inductor configured by lines connecting between the structural components.

The present disclosure can be widely used in communication apparatuses such as a mobile phone, as a radio frequency module and a communication device that are applicable to a multi-band system including an unlicensed band higher than or equal to 5 GHz.

The invention claimed is:

1. A radio frequency module, comprising:
a module board covered by a resin component, the module board including a first principal surface and a second principal surface on opposite sides of the module board;
a first terminal to which a signal of a first frequency band is inputted, the first frequency band being at least a portion of an unlicensed band higher than or equal to 5 GHz;
a second terminal to which a signal of a second frequency band is inputted, the second frequency band being at least a portion of a licensed band lower than 5 GHz;
a first amplifier configured to amplify a signal of the first frequency band inputted to the first terminal; and
a second amplifier configured to amplify a signal of the second frequency band inputted to the second terminal;
a third amplifier configured to amplify a transmission signal of the first frequency band;
a fourth amplifier configured to amplify a transmission signal of the second frequency band; and
an external-connection terminal disposed on the second principal surface,
wherein the first amplifier and the second amplifier are disposed in one package mounted on the module board and covered by the resin component,
wherein:
the first amplifier is configured to amplify a reception signal of the first frequency band,
the second amplifier is configured to amplify a reception signal of the second frequency band,
a reception signal of the first frequency band and a transmission signal of the first frequency band are transferred in a time division duplex method, and
a reception signal of the second frequency band and a transmission signal of the second frequency band are transferred in the time division duplex method,
wherein the first amplifier and the second amplifier are disposed on the second principal surface,
wherein the third amplifier and the fourth amplifier are disposed on the first principal surface, and
wherein in a plan view of the second principal surface, a control line for controlling at least one of the third amplifier or the fourth amplifier is disposed between the first amplifier and the second amplifier.

2. The radio frequency module according to claim 1, wherein
the first frequency band is one of (i) a frequency band including at least a portion of NR-U (New Radio Unlicensed) ranging from 6 GHz to 7.125 GHz or (ii) a frequency band including at least a portion of Band 46 ranging from 5.15 GHz to 5.925 GHz of 4G-LTE-LAA (the fourth generation mobile communication system-Long Term Evolution-Licensed Assisted Access).

3. The radio frequency module according to claim 1, further comprising:
a third terminal to which a signal of a third frequency band is inputted, the third frequency band being at least a portion of an unlicensed band; and
a third amplifier configured to amplify a signal of the third frequency band inputted to the third terminal, wherein
(i) a frequency range of the first frequency band is different from a frequency range of the third frequency band, or (ii) a modulation scheme of a signal of the first frequency band inputted to the first terminal is different from a modulation scheme of a signal of the third frequency band inputted to the third terminal, and
the third amplifier is disposed in the one package.

4. The radio frequency module according to claim 3, wherein
the third frequency band includes at least a portion of a wireless local area network (WLAN) ranging from 5.15 GHz to 5.925 GHz or from 5.925 GHz to 7.125 GHz.

5. The radio frequency module according to claim 1, wherein
a signal of the first frequency band and a signal of the second frequency band are transferred asynchronously.

6. The radio frequency module according to claim 1, wherein
the first amplifier and the second amplifier are included in a single semiconductor integrated circuit (IC).

7. The radio frequency module according to claim 1, wherein
in a plan view of the second principal surface, a ground terminal is disposed between the first amplifier and the second amplifier.

8. The radio frequency module according to claim 1, further comprising:
the module board including a first principal surface and a second principal surface on opposite sides of the module board, wherein
the first amplifier, the second amplifier, the third amplifier, and the fourth amplifier are disposed on the first principal surface.

9. The radio frequency module according to claim 8, wherein in a plan view of the module board, at least one of the first amplifier or the second amplifier is disposed between the third amplifier and the fourth amplifier.

10. The radio frequency module according to claim 1, wherein the third amplifier and the fourth amplifier are disposed on the module board outside the one package in which the first amplifier and the second amplifier are disposed.

11. A radio frequency module, comprising:
a module board covered by a resin component, the module board including a first principal surface and a second principal surface on opposite sides of the module board;
a first terminal to which a signal of a first frequency band is inputted, the first frequency band being at least a portion of an unlicensed band higher than or equal to 5 GHz;
a second terminal to which a signal of a second frequency band is inputted, the second frequency band being at least a portion of the unlicensed band higher than or equal to 5 GHz;
a first amplifier configured to amplify a signal of the first frequency band inputted to the first terminal;
a second amplifier configured to amplify a signal of the second frequency band inputted to the second terminal;
a third amplifier configured to amplify a transmission signal of the first frequency band;
a fourth amplifier configured to amplify a transmission signal of the second frequency band; and
an external-connection terminal disposed on the second principal surface,
wherein
the first amplifier and the second amplifier are disposed in one package mounted on the module board and covered by the resin component,
wherein:
the first amplifier is configured to amplify a reception signal of the first frequency band,
the second amplifier is configured to amplify a reception signal of the second frequency band,
a reception signal of the first frequency band and a transmission signal of the first frequency band are transferred in a time division duplex method, and
a reception signal of the second frequency band and a transmission signal of the second frequency band are transferred in the time division duplex method,
wherein the first amplifier and the second amplifier are disposed on the second principal surface,
wherein the third amplifier and the fourth amplifier are disposed on the first principal surface, and
wherein in a plan view of the second principal surface, a control line for controlling at least one of the third amplifier or the fourth amplifier is disposed between the first amplifier and the second amplifier.

12. A radio frequency module, comprising:
a module board covered by a resin component, the module board including a first principal surface and a second principal surface on opposite sides of the module board;
a first terminal to which a signal of a first frequency band is inputted, the first frequency band being at least a portion of a wireless local area network (WLAN) ranging from 5.15 GHz to 5.925 GHz or from 5.925 GHz to 7.125 GHz;
a second terminal to which a signal of a second frequency band is inputted, the second frequency band being at least a portion of NR-U (New Radio Unlicensed) ranging from 6 GHz to 7.125 GHz;
a first amplifier configured to amplify a signal of the first frequency band inputted to the first terminal;
a second amplifier configured to amplify a signal of the second frequency band inputted to the second terminal;
a third amplifier configured to amplify a transmission signal of the first frequency band;
a fourth amplifier configured to amplify a transmission signal of the second frequency band; and
an external-connection terminal disposed on the second principal surface,
wherein the first amplifier and the second amplifier are disposed in one package mounted on the module board and covered by the resin component,
wherein:
the first amplifier is configured to amplify a reception signal of the first frequency band,
the second amplifier is configured to amplify a reception signal of the second frequency band,
a reception signal of the first frequency band and a transmission signal of the first frequency band are transferred in a time division duplex method, and
a reception signal of the second frequency band and a transmission signal of the second frequency band are transferred in the time division duplex method,
wherein the first amplifier and the second amplifier are disposed on the second principal surface,
wherein the third amplifier and the fourth amplifier are disposed on the first principal surface, and
wherein in a plan view of the second principal surface, a control line for controlling at least one of the third amplifier or the fourth amplifier is disposed between the first amplifier and the second amplifier.

* * * * *